United States Patent
Hsieh et al.

(10) Patent No.: US 12,551,934 B2
(45) Date of Patent: Feb. 17, 2026

(54) SEMICONDUCTOR CLEANING APPARATUS AND METHOD

(71) Applicant: Taiwan Semiconductor Manufacturing Co., Ltd., Hsinchu (TW)

(72) Inventors: Ian Hsieh, Hsinchu (TW); Che-fu Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/874,156

(22) Filed: Jul. 26, 2022

(65) Prior Publication Data

US 2022/0355346 A1 Nov. 10, 2022

Related U.S. Application Data

(62) Division of application No. 16/656,987, filed on Oct. 18, 2019.

(51) Int. Cl.
| | |
|---|---|
| *B08B 3/10* | (2006.01) |
| *C23C 16/44* | (2006.01) |
| *H01J 37/32* | (2006.01) |
| *H01L 21/683* | (2006.01) |
| *H01L 21/687* | (2006.01) |

(52) U.S. Cl.
CPC ............ *B08B 3/10* (2013.01); *C23C 16/4407* (2013.01); *H01J 37/32862* (2013.01); *H01L 21/6833* (2013.01); *H01L 21/68785* (2013.01)

(58) Field of Classification Search
CPC ............................. B08B 3/10; H01L 21/6833
See application file for complete search history.

(56) References Cited

U.S. PATENT DOCUMENTS

| | | | |
|---|---|---|---|
| 4,674,521 | A | 6/1987 | Paulfes |
| 5,547,539 | A | 8/1996 | Arasawa et al. |
| 6,024,105 | A | 2/2000 | Hanazaki et al. |
| 6,129,046 | A | 10/2000 | Mizuno et al. |
| 6,170,496 | B1 | 1/2001 | Chen et al. |
| 6,277,235 | B1 | 8/2001 | Wing et al. |
| 6,431,185 | B1 | 8/2002 | Tomita et al. |

(Continued)

FOREIGN PATENT DOCUMENTS

| | | | | |
|---|---|---|---|---|
| WO | WO-2005074450 A2 | * | 8/2005 | ......... C23C 16/4586 |
| WO | WO-2014082196 A1 | * | 6/2014 | ....... H01L 21/67259 |

*Primary Examiner* — Sharidan Carrillo
(74) *Attorney, Agent, or Firm* — Sterne, Kessler, Goldstein & Fox P.L.L.C.

(57) ABSTRACT

The present disclosure describes a chuck-based device and a method for cleaning a semiconductor manufacturing system. The semiconductor manufacturing system can include a chamber, a chuck housed in the chamber and configured to hold a substrate, and a control device configured to control a translational displacement and a rotation of the chuck. The chuck can include a passage extending along a periphery of the chuck and dividing the chuck into an inner portion and an outer sidewall portion, and a first multiple of openings through the outer sidewall portion of the chuck and interconnected with the passage. The passage can be configured to transport a fluid. The first multiple of openings can be configured to dispense the fluid.

20 Claims, 7 Drawing Sheets

(56) References Cited

U.S. PATENT DOCUMENTS

| | | | |
|---|---|---|---|
| 6,740,853 B1 | 5/2004 | Johnson et al. | |
| 6,881,675 B2* | 4/2005 | Pan | H01L 21/02074 29/25.01 |
| 6,977,014 B1* | 12/2005 | Stevens | H01L 21/67017 414/941 |
| 7,993,465 B2 | 8/2011 | Jennings et al. | |
| 2002/0134514 A1 | 9/2002 | Yeh et al. | |
| 2003/0136428 A1 | 7/2003 | Krogh | |
| 2003/0198754 A1* | 10/2003 | Xi | C23C 16/45512 156/345.33 |
| 2003/0215569 A1 | 11/2003 | Mardian et al. | |
| 2004/0180141 A1 | 9/2004 | Kobayashi et al. | |
| 2004/0261721 A1* | 12/2004 | Steger | H01L 21/67109 118/728 |
| 2005/0008983 A1 | 1/2005 | Wang et al. | |
| 2006/0124155 A1 | 6/2006 | Suuronen et al. | |
| 2006/0207509 A1 | 9/2006 | Tomita et al. | |
| 2008/0072925 A1* | 3/2008 | Park | H01L 21/67051 134/105 |
| 2009/0235866 A1 | 9/2009 | Kataigi et al. | |
| 2010/0198550 A1 | 8/2010 | Schauer et al. | |
| 2012/0161405 A1 | 6/2012 | Mohn et al. | |
| 2012/0252220 A1 | 10/2012 | Harada et al. | |
| 2013/0134130 A1* | 5/2013 | Kelekar | H01L 21/67051 279/142 |
| 2013/0265690 A1* | 10/2013 | Maeta | H01L 21/6831 361/234 |
| 2014/0087567 A1 | 3/2014 | Toyoda et al. | |
| 2014/0262199 A1* | 9/2014 | Kobayashi | H01L 21/67248 165/61 |
| 2015/0090692 A1 | 4/2015 | Sasaki et al. | |
| 2015/0162169 A1* | 6/2015 | Chen | H01J 37/32724 156/345.33 |
| 2017/0243777 A1 | 8/2017 | Ohashi et al. | |
| 2018/0082866 A1* | 3/2018 | Alayavalli | H01L 21/67248 |
| 2018/0286642 A1 | 10/2018 | Matyushkin et al. | |
| 2018/0311707 A1 | 11/2018 | Taylor et al. | |
| 2020/0135435 A1* | 4/2020 | Hsieh | H01L 21/6833 |
| 2021/0114067 A1 | 4/2021 | Hsieh et al. | |
| 2021/0296115 A1* | 9/2021 | Yao | B08B 3/10 |
| 2022/0344136 A1 | 10/2022 | Peter et al. | |

* cited by examiner

SEMICONDUCTOR CLEANING APPARATUS AND METHOD

CROSS-REFERENCE TO RELATED APPLICATION

This patent application is a divisional of U.S. patent application Ser. No. 16/656,987, filed on Oct. 18, 2019 and titled "Semiconductor Cleaning Apparatus and Method," now U.S. Pat. No. 12,420,314, which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Such scaling down has increased the complexity of semiconductor device manufacturing processes and the demands for low contamination levels in semiconductor manufacturing systems.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
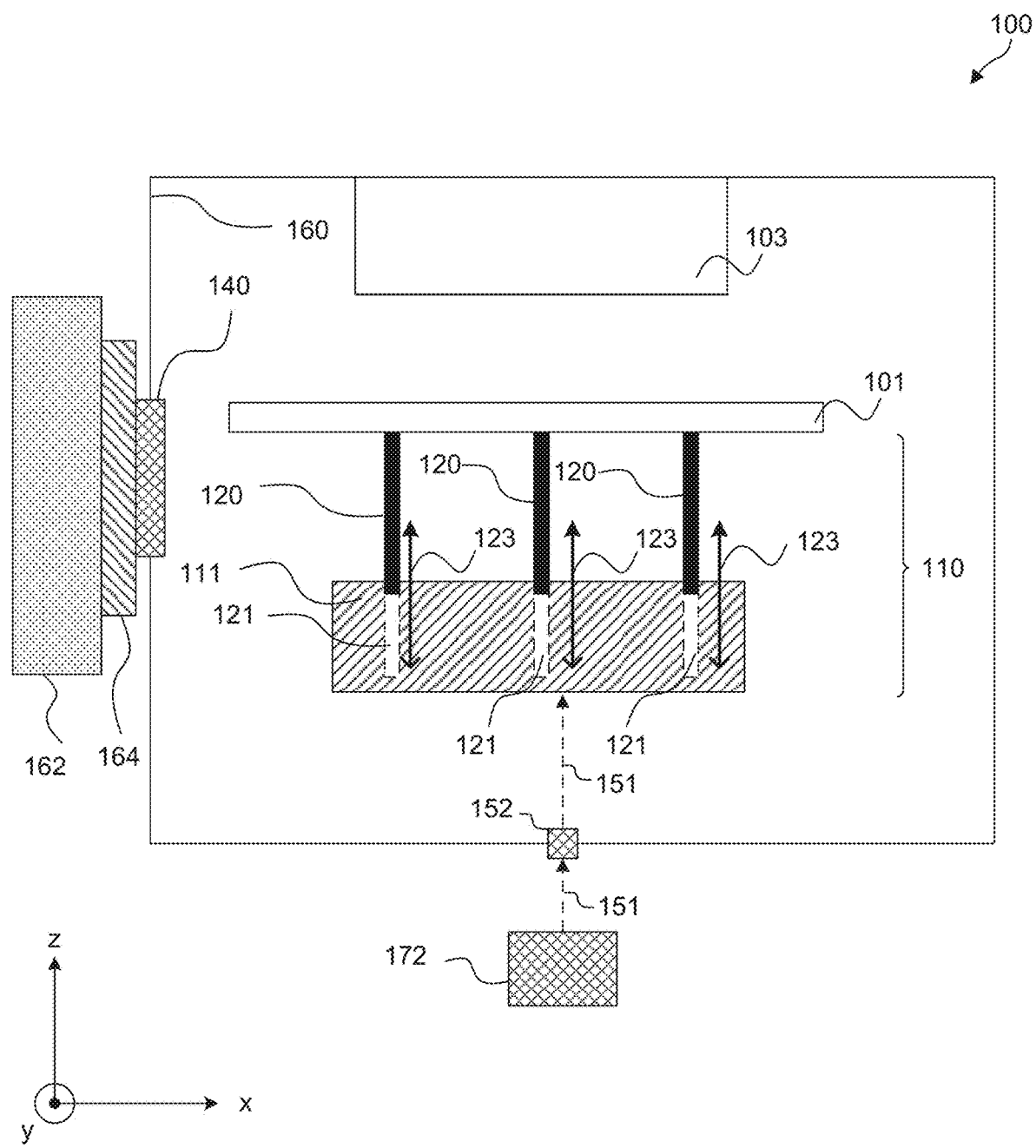
FIG. 1 illustrates a plan view of a semiconductor device manufacturing apparatus, according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, or ±5% of the value).

As used herein, the term "vertical" means nominally perpendicular to a surface, such as a substrate's surface or a stage's surface.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Semiconductor wafers are subjected to different fabrication processes (e.g., wet etching, dry etching, ashing, stripping, metal plating, and/or chemical mechanical polishing) in different semiconductor manufacturing apparatus during the fabrication of semiconductor devices. Generally, the quality of semiconductor devices depends on the performance of each semiconductor manufacturing apparatus used to form patterns of device/circuit elements on the semiconductor wafers. Another important aspect of semiconductor device manufacturing is the ability to consistently achieve a high yield of operable semiconductor devices on semiconductor wafers.

An overall yield of manufacturing semiconductor devices depends not only on an accuracy of each fabrication process, but also on a cleanliness of semiconductor manufacturing apparatus. For example, particle contaminants or accumulated chemical impurities in chambers of a semiconductor device manufacturing apparatus, such as a plasma etching apparatus or a chemical vapor deposition apparatus, can be re-deposited or outgassed on semiconductor wafers surfaces and cause manufacturing defects that reduce the yield of operable semiconductor devices. Hence, it is necessary to routinely clean components in the chambers to ensure proper fabrication yield. However, such cleaning procedures, if performed manually (e.g., hand-operated cleaning), can be time-consuming and jeopardize throughput of a semiconductor device manufacturing process.

The present disclosure is directed to a chuck-based device to conduct the cleaning procedure to reduce contaminants inside a chamber of a semiconductor manufacturing apparatus. In some embodiments, a semiconductor device manufacturing system can include a chamber and a chuck-based device housed in the chamber. The chuck-based device can be configured to hold a substrate and conduct a cleaning procedure to reduce a contamination level in the chamber. In some embodiments, the chuck-based device can be configured to dispense a decontamination fluid to clean the chamber and/or the surfaces of the chuck-based device. In some embodiments, the chuck-based device can include multiple openings formed at its sidewall and/or its top surface, where the decontamination fluid can be dispensed through the multiple openings. Since the chuck-based device is housed in the chamber, the cleaning procedure can be performed in-situ inside the chamber without disrupting operation of the semiconductor device manufacturing system (e.g., disrupting a vacuum of the chamber or opening seals of vacuum ports of the chamber), thus ensuring the overall manufacturing throughput and capacity of the semiconductor device manufacturing system.

FIG. 1 shows a plan view of a semiconductor device manufacturing apparatus 100, according to some embodiments. Semiconductor device manufacturing apparatus 100 can include a chamber 160, a chuck-based device 110 housed inside chamber 160, a loading port 162, and a transfer module 164. In some embodiments, semiconductor device manufacturing apparatus 100 can further include a cell 103 housed inside chamber 160, a gate valve 140 configured to provide an access to chamber 160, and a fluid supply system 172 configured to supply a decontamination fluid. Even though one gate valve 140, one cell 103, one loading port 162, one transfer module 164, and one fluid supply system 172 are shown in FIG. 1, semiconductor device manufacturing apparatus 100 can have more than one gate valve, cell, loading port, and/or transfer module similar to gate valve 140, cell 103, loading port 162, transfer tube 164, or fluid supply system 172, respectively.

Chamber 160 can be configured as a processing chamber to provide a high vacuum environment to conduct semiconductor device manufacturing processes on a substrate 101 that requires a vacuum environment (e.g., a vacuum pressure below $10^{-4}$ torr) to preserve, for example, a desired mean-free-path of reacting gases, plasma, and/or electrons in chamber 160 during semiconductor device manufacturing processes.

In some embodiments, the semiconductor device manufacturing processes can include deposition processes, such as molecular beam epitaxy (MBE), chemical vapor deposition (CVD), plasma-enhanced chemical vapor deposition (PECVD), low-pressure chemical vapor deposition (LPCVD), electrochemical deposition (ECD), physical vapor deposition (PVD), atomic layer deposition (ALD), metal organic chemical vapor deposition (MOCVD), sputtering, thermal evaporation, e-beam evaporation, or other deposition processes; etching processes, such as dry etching, reactive ion etching (ME), inductively coupled plasma etching (ICP), or ion milling; thermal processes, such as rapid thermal annealing (RTA); microscopy, such as scanning electron microscopy (SEM) and transmission electron microscopy (TEM); or any combination thereof.

In some embodiments, chamber 160 can be configured as a transfer chamber to transfer substrate 101 between an atmospheric environment and another processing chamber (not shown in FIG. 1) of semiconductor device manufacturing apparatus 100, where the other processing chamber can be configured to conduct the semiconductor device manufacturing processes described above. For example, chamber 160 can be purged or vented to achieve an atmospheric pressure to receive substrate 101. Chamber 160 can also be pumped down to achieve a vacuum pressure level similar to that of the processing chamber.

In some embodiments, chamber 160 can further include a fluid inlet port 152 fluidly connected to fluid supply system 172. Fluid inlet port 152 can be an opening formed through chamber 160's sidewall. A decontamination fluid (e.g., an organic solvent, such as isopropyl alcohol) provided by fluid supply system 172 can be transported to chuck-based device 110 along a fluid conduit 151 through fluid inlet port 152. Such decontamination fluid can be applied to clean chuck-based device 110's surfaces. In some embodiments, fluid supply system 172 can include a pump (not shown in FIG. 1) configured to extract the decontamination fluid from a storage container (not shown in FIG. 1). In some embodiments, other fluid conduits (not shown in FIG. 1) can be fluidly coupled to fluid inlet port 152 to transport the decontamination fluid to clean other components (not shown in FIG. 1) housed in chamber 160.

Cell 103 can be configured as a gas cell to provide one or more gases, a plasma cell to provide plasma, or an effusion cell to provide atomic/molecular beam fluxes to chamber 160. The one or more gases provided by cell 103 can include an inert gas (e.g., nitrogen or air), or any processing gas (e.g., silane or tetrafluoromethane), for the semiconductor device manufacturing processes. In some embodiments, cell 103 can be a shower head structure (not shown in FIG. 1) interconnected with a gas conduit or gas manifold. In some embodiments, cell 103 can further include an electrode structure (not shown in FIG. 1) configured to generate the plasma associated with the processing gas.

Chuck-based device 110 can be configured to support substrate 101 for performing the semiconductor device manufacturing processes on substrate 101. Chuck-based device 110 can include a platen 111 configured to hold substrate 101, and one or more supporting rods 120 configured to lift/lower substrate 101. A motion mechanism (e.g., a motor, not shown in FIG. 1) can be further included in chuck-based device 110 to allow platen 111 to be mobile and rotatable. As a result, platen 111 can be configured to rotate substrate 101 during the semiconductor device manufacturing processes. In some embodiments, platen 111 can further include one or more conduits 121 to respectively accommodate each supporting rod 120. As a result, supporting rods 120 can be configured to extend or retract vertically along bi-direction 123 (e.g., parallel to z-direction), thus being able to vertically lift (e.g., along the z-direction) or lower substrate 101. In some embodiments, a translation displacement and a rotation of substrate 101 can be provided by chuck-based device 110 (e.g., platen 111 and supporting rods 120), such that substrate 101 can rotate and move from one position to another position in chamber 160. For example, chuck-based device 110 can move substrate 101 towards/away from cell 103 by vertically (e.g., along the z-direction) lifting/lowering supporting rods 120. In some embodiments, chuck-based device 110 can move substrate 101 in a horizontal direction (e.g., along the x- or y-direction). In some embodiments, chuck-based device 110 can horizontally (e.g., along the x-y plane) rotate substrate 101 in a clockwise or a counter-clockwise direction.

In some embodiments, platen 111 can include a metallic plate, a glass plate, a plastic platform, a semiconductor wafer, or any other suitable plate made of insulating material, such as aluminum oxide ($Al_2O_3$/alumina) and/or aluminum nitride (AlN).

In some embodiments, platen 111 can have any suitable dimensions. For example, a diameter of platen 111 can be about 6 inches, about 8 inches, or other values suitable to hold substrate 101. In some embodiments, platen 111 can have a thickness of about 1 µm to about 1000 µm, about 10 µm to about 800 µm, or about 50 µm to about 700 µm (e.g., all ranges along the z-axis).

Chuck-based device 110 can be configured to self-clean surfaces of chuck-based device 110 using the decontamination fluid provided by fluid supply system 172, according to some embodiments. For example, the decontamination fluid can be dispensed to chuck-based device 110's outer surface (e.g., sidewall and top surface) through multiple openings (not shown in FIG. 1) at the chuck-based device 110's outer surface. Such decontamination fluid can carry away contaminants (e.g., particles) adhered to chuck-based device's outer surfaces. In some embodiments, platen 111 can concurrently rotate/spin during the dispensing of the decontamination fluid to facilitate the contaminant removal.

Loading port 162 can be configured to accommodate a wafer storage device (sometimes referred as front opening unified pod (FOUP)) for temporarily storing a batch of semiconductor wafers in a controlled environment with a designated gas pressure, gas ambient, humidity or temperature during intervals between the semiconductor device manufacturing processes. Loading port 162 can include a stage (not shown in FIG. 1) to hold the FOUP. In some embodiments, loading port 162 can include a chamber (not shown in FIG. 1) to accommodate the FOUP in a vacuum or an inert gas (e.g., under nitrogen ambient) environment.

Transfer module 164 can be configured to provide a central transfer conduit to transfer semiconductor wafers between loading port 162 and chamber 160. In some embodiments, transfer module 164 can include a robotic arm and a wafer orientation stage (both not shown in FIG. 1), where the robotic arm can be configured to transfer wafers between loading port 162, the wafer orientation stage, and chamber 160. In some embodiments, transfer module 164 can be configured to be at atmospheric pressure or at a vacuum environment.

In some embodiments, semiconductor device manufacturing apparatus 100 can further include a detection module (not shown in FIG. 1) housed in chamber 160 and configured to monitor surfaces of chuck-based device 110 to determine a contamination level associated with chuck-based device 110. The detection module can include a video device or an image sensor (e.g., a charge coupled device (CCD) sensor) configured to record visual signatures of chuck-based device 110, where the visual signature can include images or videos of contaminants (e.g., particles) adhered to chuck-based device 110. The images/videos can have any suitable format, such as a suitable resolution (e.g., 640 pixels×480 pixels), greyscale (e.g., 256 combinations of shades of gray), chrominance, or frame rate (e.g., 30 pictures per second). Data associated with the visual signatures can be sent to a controller unit or a computer system (both not shown in FIG. 1) for determining a contamination characteristic associated with the contaminants adhered to chuck-based device 110.

Figure 2A:
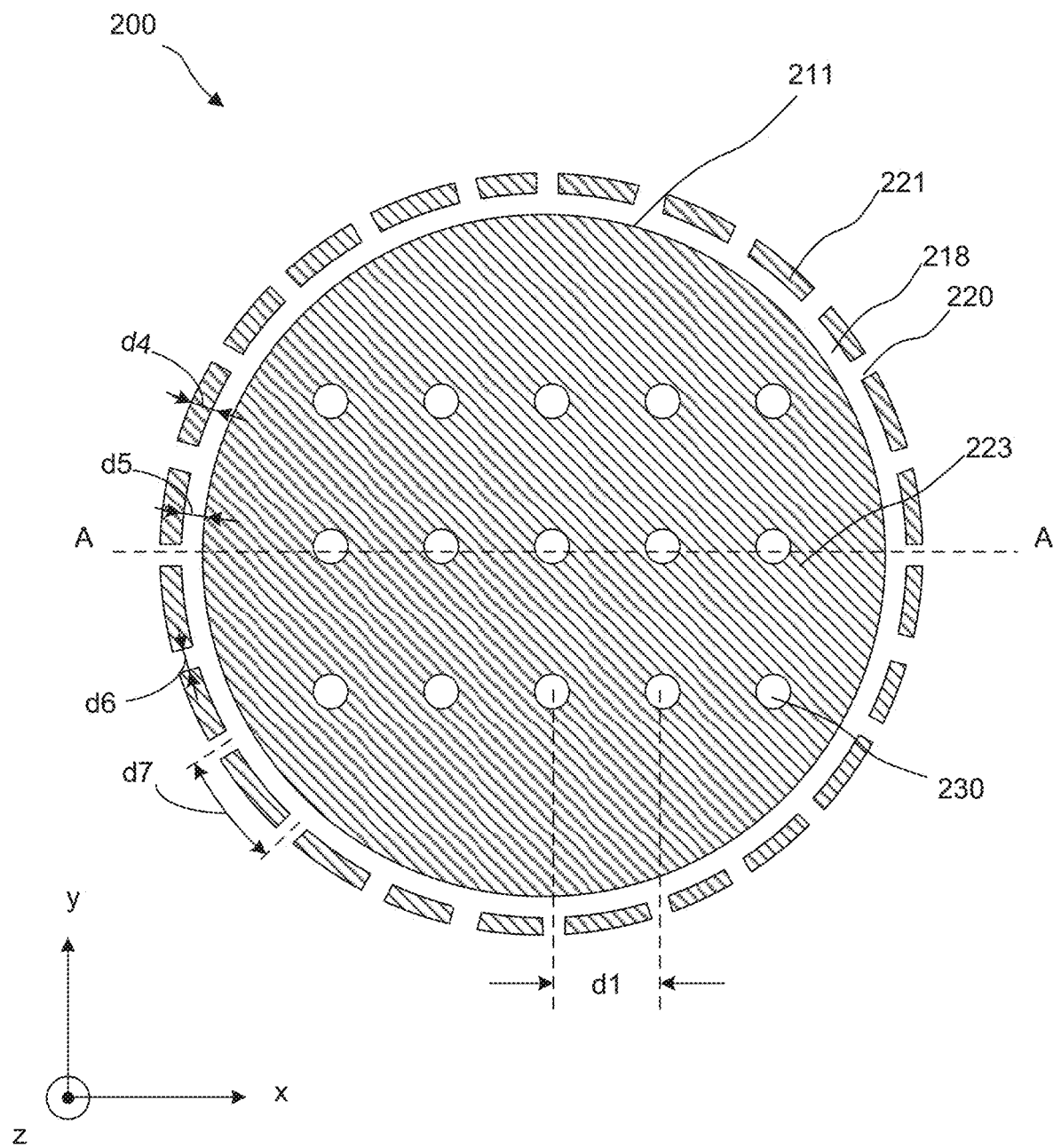
FIG. 2A illustrates a top view of a substrate-holder structure, according to some embodiments.
Figure 2B:
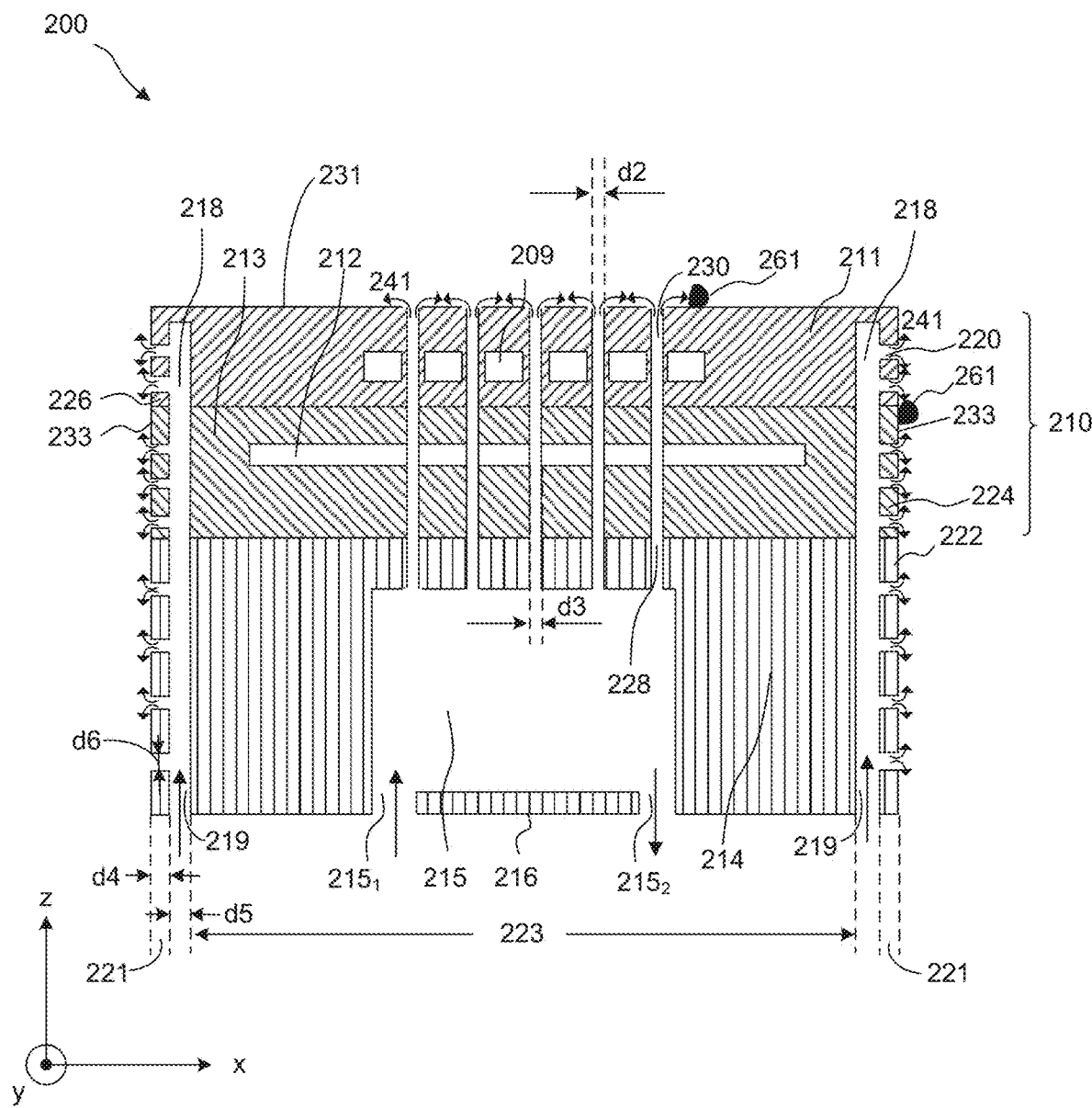
FIG. 2B illustrates a cross-sectional view of a substrate-holder structure, according to some embodiments.

FIGS. 2A and 2B illustrate a substrate-holder structure 200, according to some embodiments. FIG. 2A illustrates a top view (e.g., along the x-y plane) of substrate-holder structure 200. FIG. 2B illustrates a cross-sectional views of embodiments of substrate-holder structure 200 (e.g., along line A-A in FIG. 2A and the x-z plane). Substrate-holder structure 200 can be an embodiment of chuck-based device 110. For example, substrate-holder structure 200 can be housed inside chamber 160 of semiconductor device manufacturing apparatus 100. The discussion of chuck-based device 110 can be applied to substrate-holder structure 200, unless mentioned otherwise. Further, the discussion of elements with the same annotations in FIG. 1 and FIGS. 2A and 2B applies to each other unless mentioned otherwise.

Referring to FIGS. 2A and 2B, substrate-holder structure 200 can include a base structure 214, and an electrostatic chuck (ESC) structure 210 configured to apply an electrostatic holding force to hold substrate 101 (not shown in FIGS. 2A and 2B) for the semiconductor device manufacturing processes performed in chamber 160. In some embodiments, substrate-holder structure 200 can further include one or more supporting rods 120 (not shown in FIGS. 2A and 2B) configured to support the substrate, where supporting rods 120 can be embedded in ESC structure 210.

Referring to FIG. 2B, ESC structure 210 can be disposed over base structure 214, and can include a platen 211, an electrode 209 embedded in platen 211, a heat insulating component 213, and a heating component 212 embedded in heat insulating component 213. The discussion of platen 111 can be applied to platen 211, unless mentioned otherwise. Platen 211 can have a mounting surface 231 to place substrate 101 (not shown) for the semiconductor device manufacturing processes. Platen 211 can include any suitable insulating material, such as aluminum oxide and/or aluminum nitride. Platen 211 can have any suitable dimensions, such as a thickness of about 1 µm to about 1000 µm (e.g., along the z-axis) or a diameter between about 6 inches and about 12 inches to hold substrate 101. In some embodiments, one or more conduits 121 (not shown in FIGS. 2A and 2B) can be embedded in base platen 211 to accommodate supporting rods 120.

Referring to FIGS. 2A and 2B, platen 211 can further include multiple openings 230 formed over mounting surface 231 (e.g., a top surface 231) of platen 211. Openings 230 can be formed in any portion of the top surface 231. For example, as shown in FIG. 2A, multiple openings 230 can be arranged on platen 211's top surface 231 with a rectangle symmetry, where each opening 230's dimension along top surface 231 can be greater than about 0.1 nm, or greater than about 0.1 mm, such as greater than about 0.2 mm. In some embodiments, openings 230 can be arranged on platen 211's top surface 231 with a circular symmetry (this embodiment is not shown in FIG. 2A), where each opening 230's dimension along top surface 231 can be greater than about 0.1 nm or greater than about 0.1 mm, such as greater than about 0.2 mm. In some embodiments, openings 230 can be arranged at portions of platen 211's top surface 231 closed to periphery platen 211, where each opening 230 can be separated from periphery platen 211 about greater than about 0.2 nm or greater than about 0.2 mm. Each opening 230 can horizontally (e.g., along the x-y plane) be separated from each other by a distance d1 greater than about 0.1 nm, such as ranging from about 0.1 nm to about 0.2 nm, from about 0.1 mm to about 0.2 mm, from about 0.1 mm to about 1.0 mm, or from about 0.1 mm to about 10.0 mm.

Referring to FIG. 2B, openings 230 can be configured to dispense decontamination fluid 241 (e.g., an organic solvent) to remove contaminant 261 (e.g., particles) adhered to platen 211's top surface 231. The arrows at openings 230 can represent the directions of the flow of decontamination fluid 241. In some embodiments, a flow rate of decontamination fluid 241 from each opening 230 can range from about 3 standard cubic centimeter per minute (sccm) to about 30 sccm. In some embodiments, contaminant 261 removed by decontamination fluid 241 can be collected or captured by other components in chamber 106, such as an exhaust port (not shown in FIGS. 1 and 2A and 2B). Openings 230 can be fluidly connected to fluid inlet port 152 (not shown in FIGS. 2A and 2B) to receive and dispense decontamination fluid 241. For example, each opening 230 can fluidly connected to a passage 228 that extends through platen 211 and fluidly connects to fluid inlet port 152 to transport decontamination fluid 241. In some embodiments, passage 228 can be formed through heat insulating component 213 and base structure 214. In some embodiments, passage 228 can be formed through heat insulating component 213 and spatially by-passing heat generating component 212. In some embodiments, passage 228 can fluidly connect to inlet $215_1$ and/or outlet $215_2$ to receive decontamination fluid 241. In some embodiments, each opening 230 can have a diameter d2 greater than about 0.3 nm, such as ranging from about 0.3 nm to about 0.4 nm, from about 0.3 mm to about 0.4 mm, from about 0.3 mm to about 0.6 mm, from about 0.3 mm to about 1.0 mm, or from about 0.3 mm to about 10 mm. In some embodiments, each passage 228 can have a diameter d3 greater than about 0.4 nm, such as ranging from about 0.4 nm to about 0.5 nm, from about 0.4 mm to about 0.5 mm, from about 0.4 mm to about 1.0 mm, from about 0.4 mm to about 3.0 mm, or from about 0.4 mm to about 10 mm. In some embodiments, diameters d2 and d3 can be substantially equal to each other. In some embodiments, diameters d2 and d3 can be different from each other.

Electrode 209 can be a thin film or a conductive sheet embedded in platen 211. Electrode 209 can be connected to a power supply (inside or outside of substrate-holder structure 200, not shown) so that a voltage can be applied to electrode 209 by the power supply to generate a Coulomb force to attract the substrate to the mounting surface (e.g., top surface) of platen 211. The magnitude of the voltage can be proportional to the Coulomb force that attracts the substrate. Electrode 209 can include any suitable conductive material, such as tungsten, molybdenum, etc.

Heat generating component 212 can be connected to the power supply to generate heat when a voltage is applied to heat generating component 212. Heat generating component 212 can heat platen 211 to a desired temperature, e.g., between about 60 degrees Celsius and about 600 degrees Celsius, between about 80 degrees Celsius and about 400 degrees Celsius, or between about 100 degrees Celsius and about 300 degrees Celsius. Heat generating component 212 can include any suitable material of sufficiently low specific heat capacity, such as metals (e.g., copper (Cu), tungsten (W), and/or nickel (Ni)). Heat generating component 212 can be uniformly distributed in heat insulating component 213 and have suitable dimensions. For example, heat generating component 212 can have a thickness of about 3 μm to about 120 μm, about 5 μm to about 100 μm, or about 10 μm to about 80 μm.

Heat insulating component 213 can include an insulating material to cover heat generating component 212. Heat insulating component 213 can include a suitable insulating material, such as an insulating resin (e.g., polyimide, low-melting-point glass, alumina, and/or silica). A thermal expansion coefficient of heat insulating component 213 can be similar or comparable to a thermal expansion coefficient of base platen 211. Heat insulating component 213 can have any suitable length (e.g., along the z-axis). For example, heat insulating component 213 can have a thickness of about 10 μm to about 1.5 cm. In some embodiments, heat insulating component 213 can have a thickness of about 30 μm to about 1.0 cm or about 50 μm to about 0.8 cm.

Base structure 214 can provide support to ESC structure 210. Base structure 214 can include materials of sufficient stiffness and corrosion resistance, such as aluminum or a protection coating, e.g., an alumite layer. Base structure 214 can include a cooling component (not shown in FIGS. 2A and 2B) for adjusting the temperature of platen 211. In some embodiments, the cooling component can include a gas tunnel 215 that allows a heat transfer gas (e.g., helium gas) to circulate through inlet $215_1$ and outlet $215_2$. The arrows at inlet $215_1$ and outlet $215_2$ can indicate the directions of the gas flow. In some embodiments, base structure 214 can include a bottom portion 216 that seals gas tunnel 215 between inlet $215_1$ and outlet $215_2$. The cooling component can also include gas passages (not shown in FIGS. 2A and 2B) that connect gas tunnel 215 to mounting surface 231 of base platen 211, so the heat transfer gas can cool the surface temperature of base platen 211, thus adjusting the processing temperature of substrate 101. Optionally, the cooling component can include a coolant passage (not shown in FIGS. 2A and 2B) that allows a coolant (e.g., water) to circulate around/under heat insulating component 213 and to adjust the surface temperature of base platen 211.

In some embodiments, gas tunnel 215 can be configured to receive decontamination fluid 241 from fluid supply system 172 (not shown in FIGS. 2A and 2B). For example, inlet $215_1$ and/or outlet $215_2$ can be fluidly connected to fluid inlet port 152 (not shown in FIGS. 2A and 2B) and passage 228. As a result, decontamination fluid 241 can be transported from fluid supply system 172 to openings 230 along gas tunnel 215, fluid conduit 151 and passage 228.

Referring to FIGS. 2A and 2B, ESC structure 210 can include a passage 218 under an outer sidewall 233 of ESC structure 210. Multiple of openings 220 (e.g., through holes 220) that fluidly connect to passage 218 can be formed on outer sidewall 233. Passage 218 can be fluidly connected to fluid inlet port 152 to receive and transport decontamination fluid 241 to exit from openings 220 (e.g., directions of decontamination fluid 241 are indicated by the arrows). As a result, each opening 220 can be configured to dispense decontamination fluid 241 to remove contaminants 261 (e.g., particles) adhered to outer sidewall 233. In some embodiments, a flow rate of decontamination fluid 241 from each opening 220 can range from about 30 sccm to about 35 sccm. Passage 218 can include an inlet 219 configured to receive decontamination fluid 241 from fluid inlet port 152 (not shown in FIGS. 2A and 2B). Inlet 219 can be located at any suitable position of passage 218. For example, as shown in FIG. 2B, inlet 219 can be located at a bottom of passage 218. Inlet 219 can also include multiple of sub-inlets (not shown in FIGS. 2A and 2B) for flowing decontamination fluid 241 into passage 218 from various directions. The arrangement of inlet 219 illustrated in FIG. 2B is merely an example and other arrangements are within the spirit and scope of the present disclosure.

In some embodiments, passage 218 can extend vertically (e.g., along the z-direction) along a periphery (e.g., under outer sidewall 233) of ESC structure 210 and divide ESC structure 210 to a sidewall portion 221 and an inner portion 223. Sidewall portion 221 can include openings 220 formed through sidewall portion 221. Inner portion 223 can include electrode 209, heating component 212, portions of platen 211 that cover electrode 209, and portions of heat insulating component 213 that cover heating component 212. Sidewall portion 221 and inner portion 223 can be connected to or separated from one another. For example, when a height of ESC structure 210 is equal to a height of passage 218 (e.g., along the z-axis), sidewall portion 221 can be disconnected from inner portion 223 (e.g., passage 218 has an opened end at platen 211). When the height of ESC structure 210 is smaller than the height of gas passage 218 (e.g., along the z axis), sidewall portion 221 can be connected to inner portion 223 (e.g., passage 218 has a closed end in platen 211, as shown in FIG. 2B). In some embodiments, a thickness d4 of sidewall portion 221 can be in a range of about 0.05 mm to about 1.00 mm, or about 1.2 mm to about 1.4 mm. In some embodiments, a width d5 of passage 218 can be in a range of about 0.05 mm to about 5.0 mm, or about 1 mm to about 10 mm. In some embodiments, a size d6 of opening 220 can be in a range of about 0.05 mm to about 5 mm, or about 10 mm to 15 mm. In some embodiments, referring to FIG. 2A, ESC structure 210 can have a circular cross-sectional shape (e.g., along the x-y plane) and an arc length d7 between the geometric centers of two adjacent openings 220 (e.g., along the x-y plane) can be in a range of about 0.05 mm to about 5 mm or about 0.1 mm to about 0.2 mm.

In some embodiments, referring to FIG. 2B, passage 218 can extend vertically through a periphery of base structure 214, a periphery of heat insulating component 213, and portions of a periphery of platen 211, where passage 218 can have a closed end in platen 211. As a result, sidewall portion 221 can include outer sidewall 222 of base structure 214, outer sidewall 224 of heat insulating component 213, and outer sidewall portion 226 of platen 211. In some embodiments, multiple openings 220 can formed through one or more of the outer sidewalls 222, 224, and 226 to dispense decontamination fluid 241.

In some embodiments, passage 218 can extend through platen 211 and forms opening 230 on platen 211 to dispense decontamination fluid 241 (this embodiment is not shown in FIGS. 2A and 2B).

In some embodiments, passage 218 can surround inner portion 223, and sidewall portion 221 can surround passage 218. The cross-section of inner portion 223 (e.g., along the x-y plane) can have any suitable shape such as a circular shape, a polygonal shape, a square shape, or any irregular shape. In some embodiments, as shown in FIG. 2A, inner portion 223 can have a circular shape, while passage 218 can have a ring shape that surrounds inner portion 223 (e.g., along the x-y plane), and sidewall portion 221 can have a ring shape that surrounds inner portion 223 and/or passage 218 (e.g., along the x-y plane).

In some embodiments, referring to FIG. 2A, passage 218 can continuously surround inner portion 223 from all directions (e.g., along the x-y plane). In some embodiments, passage 218 can surround a portion of inner portion 223. In some embodiments, passage 218 can include multiple of sub-passages (not shown in FIGS. 2A and 2B), where each sub-passage can surround inner portion 223 from a different direction. Each gas sub-passage can be fluidly connected to fluid supply system 172 (not shown in FIGS. 2A and 2B) to receive and transport decontamination fluid 241.

In some embodiments, platen 211 can be configured to rotate to form a centrifugal force. The centrifugal force can to assist decontamination fluid 241 to carry away contaminant 261 from platen 211's top surface 231 and/or sidewall 233 (e.g., outer sidewalls 222, 224, and 226).

Figure 3:
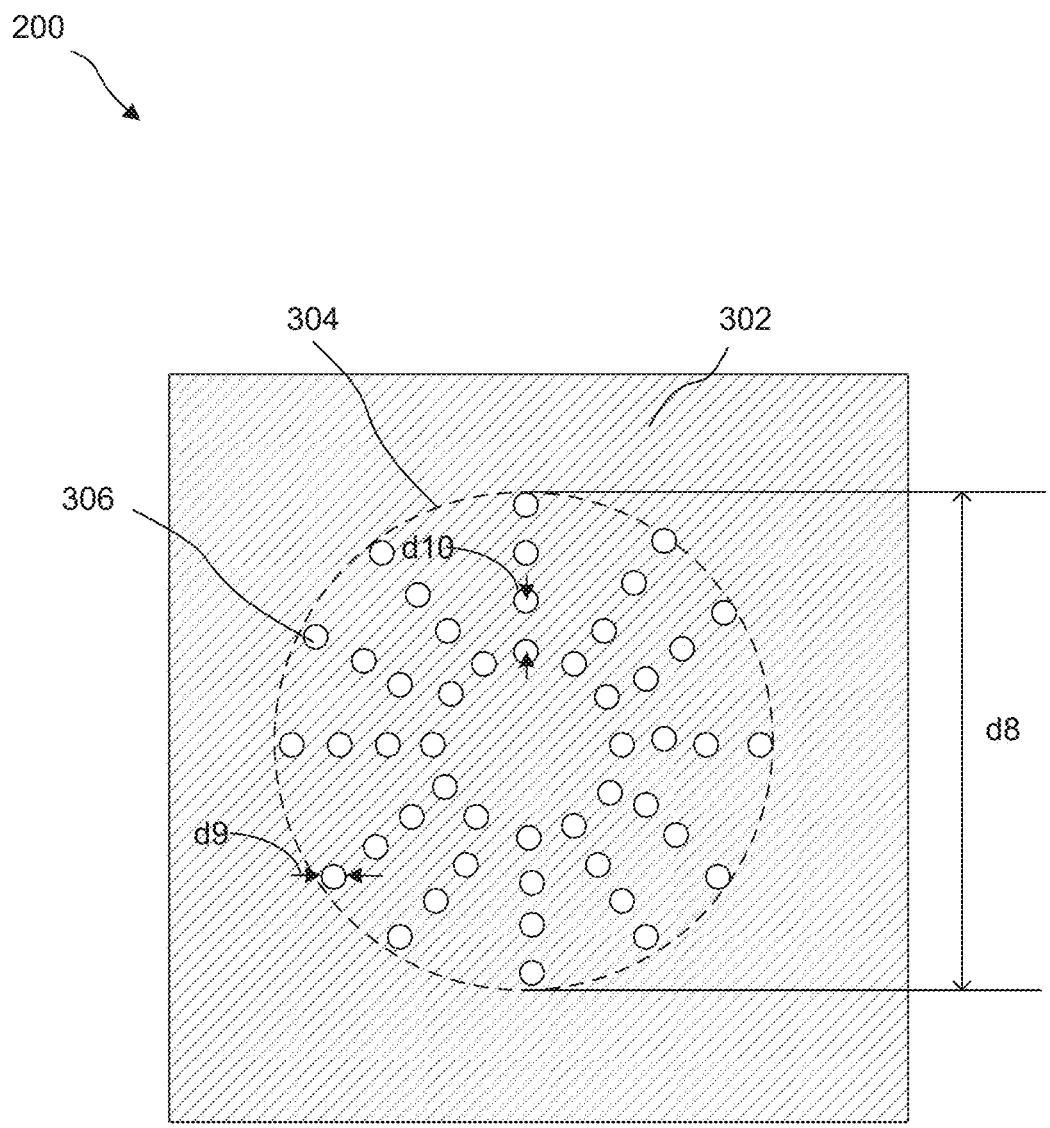
FIG. 3 illustrates a plan view of an opening on a surface of a substrate-holder structure, according to some embodiments.

FIG. 3 illustrates an opening on a surface of substrate-holder structure 200, according to some embodiments. Referring to FIG. 3, substrate-holder structure 200 can include an outer surface 302, and an opening 304 formed over outer surface 302. In some embodiments, outer surface 302 can be platen 211's top surface 231, and opening 304 can be opening 230. In some embodiments, outer surface 302 can be substrate-holder structure 200's outer sidewall 233, and opening 304 can be openings 220. In some embodiments, outer surface 302 can be outer sidewalls 222, 224, or 226, where opening 304 can represent opening 220. Opening 304 can have a size d8 that can be similar to identical to the previously discussed opening 220's size d6 and/or opening 230's diameter d2. As shown in FIG. 3, opening 304 can include multiple holes 306, where each hole 306 can be fluidly connected to passage 218 and/or passage 228 (both not shown in FIG. 3). As a result, opening 304 can be configured to dispense decontamination fluid 241 (not shown in FIG. 3) to remove contaminant 261 adhered to outer surface 302 (not shown in FIG. 3). In some embodiments, each hole 306 can have a diameter d9 ranging from 12 mm to 20 mm. In some embodiments, holes 306 can be arranged with a circular symmetry on outer surface 302, as illustrated in FIG. 3. In some embodiments, holes 306 can be arranged with a rectangle symmetry on outer surface 302. In some embodiments, holes 306 can be arranged uniformly on outer surface 302, where a separation d10 between any two adjacent holes 306 can be substantially equal to each other. In some embodiments, separation d10 between each hole 306 can range from 15 mm to 20 mm. In some embodiments, holes 306 can be arranged randomly on outer surface 302. In some embodiments, opening 304 can include any number of holes 306. In some embodiments, opening 304 can include a single hole 306, where a size of the single hole 306 can have substantially equal size as d8. The arrangement and size of holes 306 illustrated here are merely examples, and other arrangements and sizes are within the spirit and scope of the present disclosure.

Figure 4:
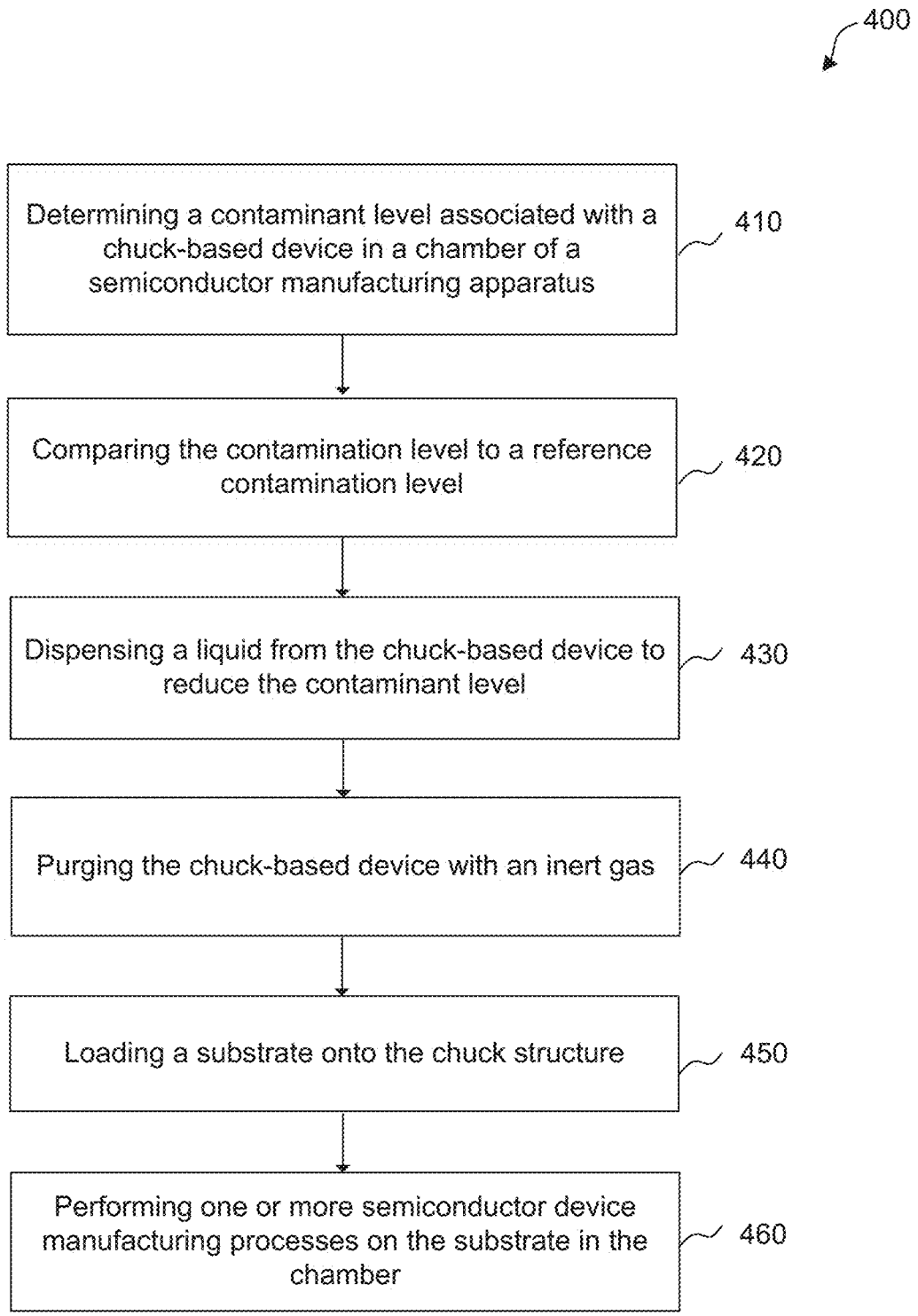
FIG. 4 illustrates a method for operating a semiconductor device manufacturing apparatus, according to some embodiments.

FIG. 4 is an exemplary method 400 for operating a chuck-based device to clean a semiconductor manufacturing apparatus, where the chuck-based device can be housed in an interior of a chamber of a semiconductor manufacturing apparatus, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 4. In some implementations, one or more other operations may be performed in addition to or in place of the presently described operations. For illustrative purposes, method 400 is described with reference to the embodiments of FIGS. 1, 2A-2B, and 3. However, method 400 is not limited to this embodiment.

Exemplary method 400 begins with operation 410, where a contamination level of a chuck-based device in a chamber of a semiconductor device manufacturing apparatus is determined. The contamination level of the chuck-based device can be a level of particles that adheres to the surfaces of the chuck-based device. The contamination level can also be a level of chemical by-products from previous manufacturing processes that adheres to the chuck-based device. The contamination level of the chuck-based device can be determined by placing a sample substrate in the chamber, followed by detecting respective contaminants transferred from the chuck-based device to the sample substrate surface. For example, the sample substrate can be a semiconductor wafer or any other plates, such as a glass, plastic, or metallic plate. The sample substrate can be placed on the chuck-based device or any other stage/platform in the chamber. After the sample substrate is loaded in the chamber, one or more semiconductor processes associated with the chamber can be optionally applied to the sample substrate. For example, the chamber configured to conduct reactive ion-etching (RIE) can apply the respective RIE processes on the sample substrate. The sample substrate can then be transferred out the chamber, followed by detecting the respective contamination level on one or more areas the sample substrate surface via a particle counter, surface profiler, and/or any microscopy. In some embodiments, the respective contamination level can be detected via any surface chemistry analysis technique, such as X-ray photoelectron (XPS) or energy-dispersive X-ray spectroscopy (EDAX).

In some embodiments, the contamination level can be associated with a visual signature at the chuck-based device. Therefore, the contamination level of the chuck-based device can be determined by collecting a visual signature (e.g., images or videos) of one or more areas of the chuck-based device via a video device or an image sensor, where the visual signature can include information of color saturation, color gradation, contrast, or brightness associated with the contaminants at the drain cup structure. In some embodiments, the video device or the image sensor can be in the chamber. In some embodiments, the video device or the image sensor can be delivered from outside the chamber using a robotic arm of a transfer module of the semiconductor device manufacturing apparatus.

In operation 420, the contamination level is compared to a reference level. The reference level can be a pre-determined threshold of a particle count or a pre-determined threshold of an amount of a chemical trace. The reference level can represent or be associated with a desired cleanliness requirement of the semiconductor manufacturing apparatus's chuck-based device. For example, the reference level can be a pre-determined threshold of particle count, where a fabrication process performed in a chamber with or below the reference level of particle count can achieve a desired production yield of semiconductor device manufacturing. As another example, the reference level can be a pre-determined atomic concentration of a chemical trace (e.g., heavy metal trace), where a manufacturing of semiconductor devices performed in a chamber with or below the reference level of the chemical trace can generate a high purity of semiconductor device layers, thus achieving a desired electrical performance of semiconductor devices. In some embodiments, the reference level can be determined or learned from one or more historical semiconductor device manufacturing processes performed in the chamber or another similar semiconductor manufacturing apparatus. The comparison between the contamination level and the reference level can include subtracting the contamination level from the reference level. In some embodiments, the comparison can include subtracting the contamination level from an averaged attribute (e.g., an averaged particle count from one or more areas of the sample substrate) of the reference level. In some embodiments, the comparison can be performed by a computer system as described in FIG. 6.

In response to the contamination level being equal to or above the reference level, the semiconductor manufacturing apparatus is cleaned based on operations 430 and 440.

In operation 430, a liquid is dispensed from the chuck-based device to reduce the contamination level. For example, as described in FIGS. 2A and 2B, the liquid (e.g., an organic solvent, an isopropanol, or an alcohol) can be sprayed from multiple openings at the chuck-based device's sidewall to dissolve or carry away the contaminants adhered to the chuck-based device's sidewall. The liquid can also be sprayed from other multiple openings on the chuck-based device's top surface to dissolve or carry away the contaminants adhered to the chuck-based device's top surface. In some embodiments, the chuck-based device can rotate while the liquid is dispensed from the chuck-based device. Such rotation can provide a centrifugal force to facilitate contaminant removal by the sprayed liquid. In some embodiments, more than one species of the fluid are dispensed by the chuck-based device to reduce the contaminants. For example, the chuck-based device can dispense a first fluid (e.g., acetone) that can reduce a first group of the contaminants, followed by dispensing a second fluid (e.g., isopropanol) that can reduce a second group of the contaminants and also carry away the residue of the first fluid. In some embodiments, the chamber can be under the atmospheric environment, while the chuck-based device dispenses the fluid. In some embodiments, the chamber can be pumped down to provide a vacuum in the chamber, while the chuck-based device dispenses the fluid to remove the contaminants. Such vacuum in the chamber can facilitate an extraction of the fluid dispensed from the chuck-based device, thus increasing a strength of the dispensed liquid to remove the contaminants. In some embodiments, the chuck-based device can increase its temperature while dispensing the liquid to remove the contaminants. Such temperature increasing can facility the liquid to dissolve the contaminants. Details of operation 430 can be referred to the description of FIGS. 1, 2A, and 2B.

In operation 440, the chamber or the chuck-based device is purged with an inert gas. Since the liquid (e.g., organic solvent) used to remove the contaminants can be left on the surfaces of the chuck-based device, the purging can be applied to blow dry the liquid from the chuck-based device. In some embodiments, the purging can be conducted by flowing the inert gas (e.g., nitrogen) from a cell (e.g., the plasma cell or the gas cell) or any other gas outlet in the chamber. In some embodiments, the chuck-based device can be shifted towards the cell or the gas outlets to receive stronger inert gas purging to remove the residue of the liquid.

In some embodiments, after dispensing the liquid to remove the contaminants, method 400 can be looped back to operations 410-420 to inspect the contamination level before proceeding to operation 450.

In operation 450, a substrate can be loaded onto the chuck-based device in the chamber. The chuck-holder structure can attract and fix the substrate on the mounting surface of the chuck-based device. In some embodiments, the substrate can be loaded onto the chuck-based device using a robotic arm of a transfer module of the semiconductor device manufacturing apparatus.

In operation 460, one or more semiconductor device manufacturing processes are performed on the substrate in the chamber. For example, as described with reference to FIG. 1, one or more semiconductor device manufacturing processes can be performed on the substrate placed on the chuck-based device. The one or more semiconductor manufacturing procedures can include deposition processes such as MBE, CVD, PECVD, LPCVD, ECD, PVD, ALD, MOCVD, sputtering, thermal evaporation, e-beam evaporation, or other deposition processes; etching processes such as dry etching, RIE, ICP, and ion milling; thermal process such as RTA; and microscopy such as SEM, and TEM; or any combination thereof. In some embodiments, a high vacuum (e.g., between about 1 mtorr to about 10 mtorr) is preserved within the chamber during the one or more manufacturing processes.

Figure 5:
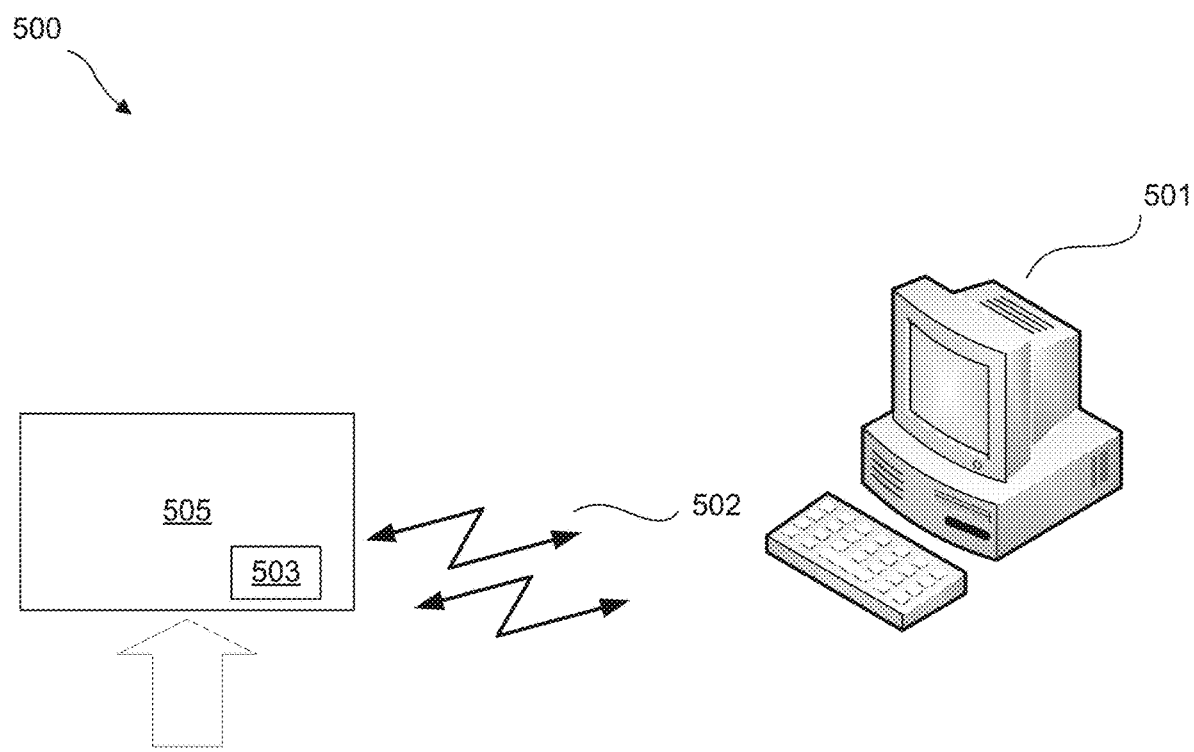
FIG. 5 illustrates a control system, according to some embodiments.

FIG. 5 illustrates a semiconductor device manufacturing system 500 using a chuck-based device of the present disclosure, according to some embodiments. As shown in FIG. 5, semiconductor device manufacturing system 500 can include a control unit/device 501, a communication mechanisms 502, and a chuck-based device 503 contained in a semiconductor device manufacturing apparatus 505. Control unit/device 501 can include any suitable computer system (e.g., workstation and portable electronic device) to store programs and data for various operations of semiconductor device manufacturing apparatus 505, such as instructing semiconductor device manufacturing apparatus 505 to conduct a semiconductor device manufacturing process on a substrate placed on chuck-based device 503 and controlling a motion of chuck-base device 503, where the motion can be a translational displacement or a rotation. The different functions of control unit/device 501 are not limited by the embodiments of the present disclosure.

Communication mechanism 502 can include any suitable network connection between control unit/device 501 and semiconductor device manufacturing apparatus 505. For example, communication mechanism 502 can include a local area network (LAN) and/or a WiFi network. In some embodiments, control unit/device 501 can transmit control signals through communication mechanism 502 to control the motion of chuck-based device 503. Chuck-based device 503 can be housed in a chamber of semiconductor device manufacturing apparatus 505, where chuck-based device 503 and semiconductor device manufacturing apparatus 505 can be an embodiment of chuck-based device 110 and semiconductor device manufacturing apparatus 100, respectively. In some embodiments, chuck-based device 503 can include an ESC structure configured to provide an electrostatic force to attract a substrate to a stage of chuck-based device 503.

Figure 6:
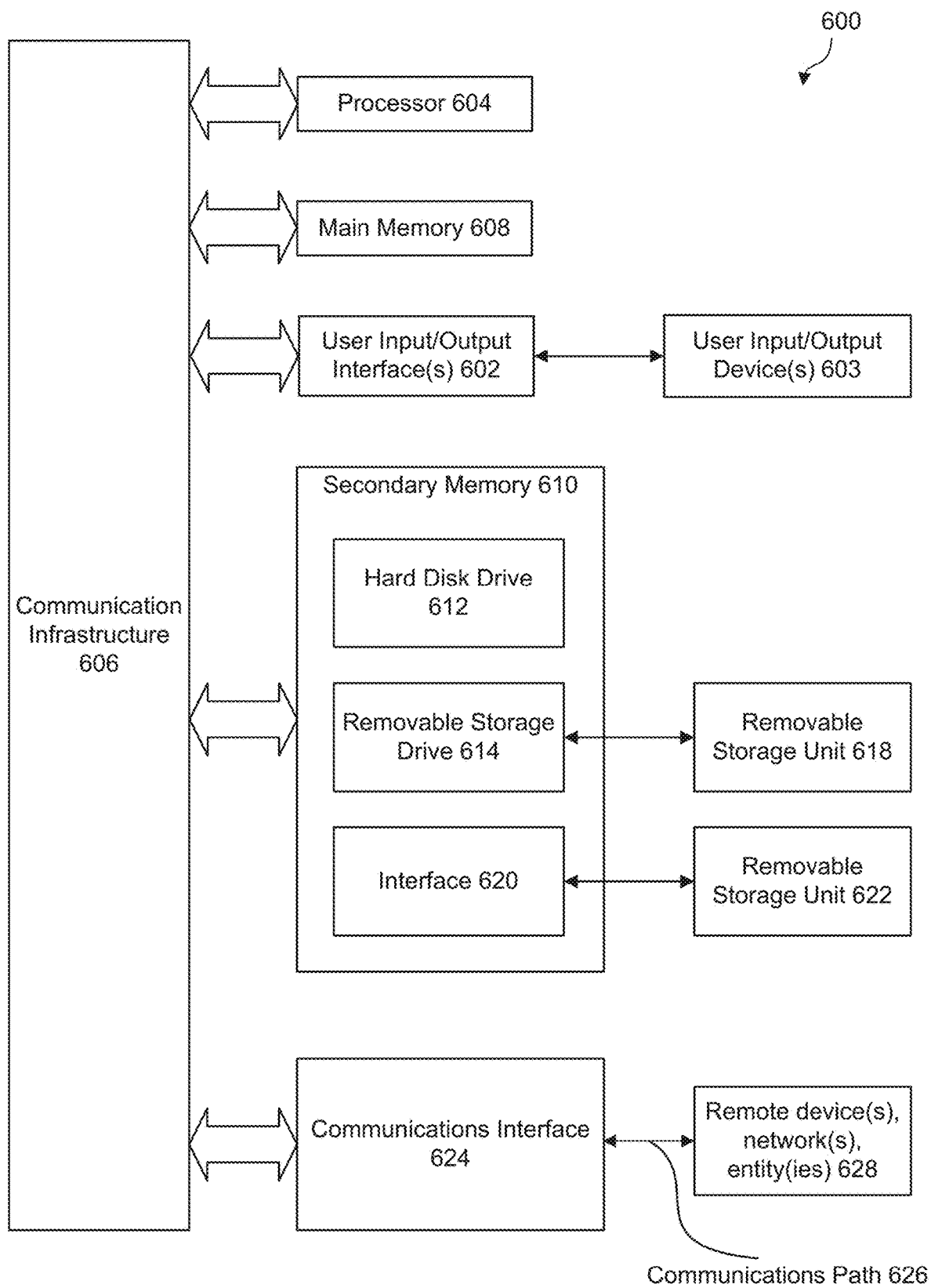
FIG. 6 illustrates a computer system for implanting various embodiments of the present disclosure, according to some embodiments.

FIG. 6 is an illustration of an example computer system 600 in which various embodiments of the present disclosure can be implemented, according to some embodiments. Computer system 600 can be used, for example, in control unit/device 501 of FIG. 5. Computer system 600 can be any well-known computer capable of performing the functions and operations described herein. For example, and without limitation, computer system 600 can be capable of processing and transmitting signals. Computer system 600 can be used, for example, to control the motion of chuck-based device 503.

Computer system 600 includes one or more processors (also called central processing units, or CPUs), such as a processor 604. Processor 604 is connected to a communication infrastructure or bus 606. Computer system 600 also includes input/output device(s) 603, such as monitors, keyboards, pointing devices, etc., that communicate with communication infrastructure or bus 606 through input/output interface(s) 602. A control tool can receive instructions to implement functions and operations described herein—e.g., the functions of semiconductor device manufacturing apparatus 100 described in FIG. 1, functions of substrate-holder structure 200 described in FIGS. 2A and 2B, the method/process described in FIG. 4, and the functions of semiconductor device manufacturing apparatus 500 described in FIG. 5, and—via input/output device(s) 603. Computer system 600 also includes a main or primary memory 608, such as random access memory (RAM). Main memory 608 can include one or more levels of cache. Main memory 608 has stored therein control logic (e.g., computer software) and/or data. In some embodiments, the control logic (e.g., computer software) and/or data can include one or more of the functions described above with respect to semiconductor device manufacturing apparatus 100. In some embodiments, processor 604 can be configured to execute the control logic stored in main memory 608.

Computer system 600 can also include one or more secondary storage devices or memory 610. Secondary memory 610 can include, for example, a hard disk drive 612 and/or a removable storage device or drive 614. Removable storage drive 614 can be a floppy disk drive, a magnetic tape drive, a compact disk drive, an optical storage device, tape backup device, and/or any other storage device/drive.

Removable storage drive 614 can interact with a removable storage unit 618. Removable storage unit 618 includes a computer usable or readable storage device having stored thereon computer software (control logic) and/or data. Removable storage unit 618 can be a floppy disk, magnetic tape, compact disk, DVD, optical storage disk, and/any other computer data storage device. Removable storage drive 614 reads from and/or writes to removable storage unit 618 in a well-known manner.

According to some embodiments, secondary memory 610 can include other mechanisms, instrumentalities or other approaches for allowing computer programs and/or other instructions and/or data to be accessed by computer system 600. Such mechanisms, instrumentalities or other approaches can include, for example, a removable storage unit 622 and an interface 620. Examples of the removable storage unit 622 and the interface 620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 610, removable storage unit 618, and/or removable storage unit 622 can include one or more of the functions described above with respect to semiconductor device manufacturing apparatus 100.

Computer system 600 can further include a communication or network interface 624. Communication interface 624 enables computer system 600 to communicate and interact with any combination of remote devices, remote networks, remote entities, etc. (individually and collectively referenced by reference number 628). For example, communication interface 624 can allow computer system 600 to communicate with remote devices 628 over communications path 626, which can be wired and/or wireless, and which can include any combination of LANs, WANs, the Internet, etc. Control logic and/or data can be transmitted to and from computer system 600 via communication path 626.

The functions/operations in the preceding embodiments can be implemented in a wide variety of configurations and architectures. Therefore, some or all of the operations in the preceding embodiments—e.g., the functions of semiconductor device manufacturing apparatus 100 described in FIG. 1, functions of substrate-holder structure 200 described in FIGS. 2A and 2B, method 400 described in FIG. 4, and the functions of semiconductor device manufacturing apparatus 500 described in FIG. 5—can be performed in hardware, in software or both. In some embodiments, a tangible apparatus or article of manufacture including a tangible computer useable or readable medium having control logic (software)

stored thereon is also referred to herein as a computer program product or program storage device. This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein. For example, the hardware/equipment can be connected to or be part of element 628 (remote device(s), network(s), entity(ies) 628) of computer system 600.

In some embodiments, a semiconductor device manufacturing system can include a chamber, a chuck housed in the chamber and configured to hold a substrate, and a control device configured to control a translational displacement and a rotation of the chuck. The chuck can include a passage extending along a periphery of the chuck and dividing the chuck into an inner portion and an outer sidewall portion, and a first multiple of openings through the outer sidewall portion of the chuck and interconnected with the passage. The passage can be configured to transport a fluid. The first multiple of openings can be configured to dispense the fluid.

In some embodiments, an apparatus can include a base structure, and a platen disposed over the base structure and configured to hold a substrate. The base structure can include a passage extending along a periphery of the base structure and dividing the base structure into an inner portion and an outer portion. A top surface of the platen can include multiple of openings configured to dispense a fluid.

In some embodiments, a method can include determining a contamination level of a chuck of a semiconductor device manufacturing apparatus, dispensing a decontamination fluid using the chuck, and purging the chuck using an inert gas.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   determining a contamination level of a substrate holder inside a vacuum chamber of a semiconductor device manufacturing system, wherein the substrate holder comprises a platen and a heat insulating layer disposed on a base structure;
   providing a decontamination fluid into a tunnel formed in the base structure;
   transporting the decontamination fluid from the tunnel to a first plurality of openings in sidewall surfaces of the platen, sidewall surfaces of the heat insulating layer, and sidewall surfaces of the base structure, wherein the first plurality of openings are interconnected with the tunnel;
   providing the decontamination fluid through a heat generating device embedded in the heat insulating layer;
   dispensing the decontamination fluid through a second plurality of openings in the platen while increasing a temperature of the decontamination fluid by the heat generating device; and
   purging the platen using an inert gas.

2. The method of claim 1, wherein determining the contamination level comprises:
   placing a substrate in the vacuum chamber;
   performing a semiconductor device manufacturing process on the substrate;
   determining a particle count on a surface of the substrate; and
   comparing the particle count to a reference contamination level.

3. The method of claim 1, wherein determining the contamination level comprises monitoring a visual signature of contaminants by a detection module.

4. The method of claim 1, wherein dispensing the decontamination fluid comprises spraying the decontamination fluid from the first plurality of openings in the sidewalls of the platen.

5. The method of claim 1, further comprising rotating the platen while dispensing the decontamination fluid.

6. The method of claim 1, wherein the vacuum chamber is maintained at a vacuum pressure below 0.1 mTorr.

7. The method of claim 1, wherein dispensing the decontamination fluid comprises dispensing an organic solvent comprising one or more of acetone and isopropyl alcohol.

8. The method of claim 1, wherein providing the decontamination fluid comprises flowing the decontamination fluid through a ring-shaped passage surrounding the heat generating device.

9. A method, comprising:
   providing a substrate holder comprising a platen, a heating insulating layer, and a base structure, wherein the heat insulating layer is disposed between the platen and the base structure;
   flowing a first decontamination fluid through a passage extending along a periphery of the substrate holder in a vacuum chamber;
   dispensing the first decontamination fluid through a first plurality of openings in sidewall surfaces of the platen, sidewall surfaces of the heat insulating layer, and sidewall surfaces of the base structure, wherein the first plurality of openings are interconnected with the passage; and
   rotating the platen while dispensing the first decontamination fluid.

10. The method of claim 9, further comprising flowing the first decontamination fluid through a tunnel in the base structure.

11. The method of claim 9, further comprising dispensing the first decontamination fluid through a second plurality openings in a top surface of the platen.

12. The method of claim 9, further comprising controlling of the platen using a control device.

13. The method of claim 9, further comprising repeating the flowing, dispensing, and rotating operations using a second decontamination fluid.

14. The method of claim 10, wherein flowing the first decontamination fluid through the tunnel comprises flowing the first decontamination fluid through an inlet port of the tunnel, wherein the tunnel is fluidly connected to the platen and configured to supply the first decontamination fluid to the platen.

15. The method of claim 11, further comprising increasing a temperature of the first decontamination fluid by flowing the first decontamination fluid through a plurality of passages surrounded by a heat insulating component, wherein the plurality of passages are connected to the second plurality of openings.

16. A method, comprising:
providing a substrate holder comprising a platen and a heat insulating layer disposed on a base structure, wherein the heat insulating layer is disposed between the platen and the base structure;
flowing a fluid through a passage extending along a periphery of the base structure, a periphery of the heat insulating layer, and a periphery of the platen, wherein the passage divides each of the platen, the heat insulating layer, and the base structure into an inner portion and an outer sidewall portion, wherein an inner portion of the heat insulating layer embeds a heat generating component;
dispensing the fluid through a first plurality of openings in sidewall surfaces of the platen, sidewall surfaces of the heat insulating layer, and sidewall surfaces of the base structure, wherein the first plurality of openings are interconnected with the passage; and
dispensing the fluid through a second plurality of openings in a top surface of the platen while the platen rotates.

17. The method of claim 16, further comprising flowing the fluid through a tunnel in an inner portion of the base structure.

18. The method of claim 16, wherein dispensing the fluid through the second plurality of openings in the top surface of the platen comprises flowing the fluid in another passage through the heat generating component.

19. The method of claim 16, further comprising flowing a heat transfer gas through a tunnel in the base structure.

20. The method of claim 17, wherein flowing the fluid through the tunnel further comprises flowing the fluid through an inlet port connected to the tunnel.

* * * * *